United States Patent
Hirano et al.

(10) Patent No.: US 7,541,644 B2
(45) Date of Patent: Jun. 2, 2009

(54) SEMICONDUCTOR DEVICE WITH EFFECTIVE HEAT-RADIATION

(75) Inventors: Yuuichi Hirano, Tokyo (JP); Shigenobu Maeda, Seoul (KR); Takuji Matsumoto, Kanagawa (JP); Takashi Ipposhi, Tokyo (JP); Shigeto Maegawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 33 days.

(21) Appl. No.: 10/793,841

(22) Filed: Mar. 8, 2004

(65) Prior Publication Data

US 2004/0232554 A1 Nov. 25, 2004

(30) Foreign Application Priority Data

May 23, 2003 (JP) ............................. 2003-146071

(51) Int. Cl.
*H01L 29/72* (2006.01)
(52) U.S. Cl. .................... 257/347; 257/618; 257/712
(58) Field of Classification Search ............... 257/347, 257/706, 707, 712–13, 720, E27.112, E23.087, 257/E23.105, E23.103, 758, 618; 361/704, 361/709, 712, 713
See application file for complete search history.

(56) References Cited

U.S. PATENT DOCUMENTS

| 5,313,094 | A | 5/1994 | Beyer et al. | |
|---|---|---|---|---|
| 6,071,803 | A | 6/2000 | Rutten et al. | |
| 6,352,882 | B1 * | 3/2002 | Assaderaghi et al. | 438/155 |
| 6,531,753 | B1 * | 3/2003 | Lin | 257/508 |
| 6,573,565 | B2 * | 6/2003 | Clevenger et al. | 257/355 |
| 6,750,548 | B2 * | 6/2004 | Farnworth | 257/779 |
| 2002/0150683 | A1 * | 10/2002 | Troian et al. | 427/256 |
| 2003/0122215 | A1 | 7/2003 | Wilson | |
| 2004/0104452 | A1 * | 6/2004 | Yamaguchi | 257/536 |
| 2005/0029643 | A1 * | 2/2005 | Koyanagi | 257/680 |

FOREIGN PATENT DOCUMENTS

| JP | 2-303141 | 12/1990 |
|---|---|---|
| JP | 4-356967 | 12/1992 |
| JP | 5-267443 | 10/1993 |
| JP | 6-29376 | 2/1994 |
| JP | 6-310633 | 11/1994 |
| JP | 10-50999 | 2/1998 |
| JP | 11-354807 | 12/1999 |
| JP | 2002-124564 | 4/2002 |
| JP | 2002-198493 | 7/2002 |

* cited by examiner

*Primary Examiner*—Edward Wojciechowicz
(74) *Attorney, Agent, or Firm*—Oblon, Spivak, McClelland, Maier & Neustadt, P.C.

(57) ABSTRACT

The semiconductor device has a silicon layer (SOI layer) (12) formed through a silicon oxide film (11) on a support substrate (10). A transistor (T1) is formed in the SOI layer (12). The wiring (17a) is connected with a source of the transistor (T1) through a contact plug (15a). A back metal (18) is formed on an under surface (back surface) of the support substrate (10) and said back metal (18) is connected with the wiring (17a) through a heat radiating plug (16). The contact plug (15a), the heat radiating plug (16) the wiring (17a) and the back metal (18) is made of a metal such as aluminum, tungsten and so on which has a higher thermal conductivity than that of the silicon oxide film (11) and the support substrate (10).

10 Claims, 11 Drawing Sheets

SEMICONDUCTOR DEVICE WITH EFFECTIVE HEAT-RADIATION

BACKGROUND OF THE INVENTION

1. Field of the Invention

The present invention relates to a technique to perform an effective heat radiation in a semiconductor device having a SOI (Silicon on Insulator) structure.

2. Description of the Background Art

Generally, a semiconductor device having a SOI structure (SOI device) has a silicon layer (SOI layer) formed on a support substrate through a silicon oxide film ($SiO_2$). Accordingly, a semiconductor element such as, for example, a transistor and so on, formed on the SOI layer, has a structure that its periphery is covered with the silicon oxide film. A thermal conductivity of the silicon oxide film is extremely low as compared with silicon (Si) constituting the support substrate, aluminum (Al) employed for wirings and so on. Therefore, with regard to the SOI device, a heat which is generated in the transistor formed on the SOI layer is hard to let off outside, and a phenomenon that a temperature of the transistor rises and a flowing current decreases (self-heating effect) occurs. When a current flowing in the transistor drops caused by the self-heating effect, instability and malfunction of an operation of the SOI device can occur. Accordingly, a technique to raise a heat-radiating effect of the SOI device is conventionally suggested.

For example, a technique to let off the heat generated in the SOI layer to the support substrate by forming a trench isolation and a contact which are in contact with the SOI layer and the support substrate for the heat radiation is suggested (Japanese Patent Application Laid-Open Nos. 10-50999 (1998), pp. 3 to 5, FIGS. 1 and 2, 11-354807 (1999), pp. 4 to 7, FIG. 1, 2002-124564, pp. 3 and 4, FIG. 2, 2002-198493, pp. 3 and 4, FIGS. 1 to 7 and 5-267443 (1993), pp. 3 and 4, FIGS. 1 to 20, for example). Moreover, there is also a technique to remove the support substrate in a SOI substrate and join an oxide film below the SOI layer directly with an upper surface of a radiating fin (Japanese Patent Application Laid-Open No. 6-310633 (1994), pp. 4, FIG. 2, for example). A technique to raise the heat-radiating effect by forming an alloy layer with diffusing a metal on the support substrate is also suggested (Japanese Patent Application Laid-Open No. 2-303141 (1990), pp. 2 and 3, FIG. 1, for example). Moreover, there is also a technique to raise the heat-radiating effect by making the support substrate thin by a polishing and forming a metal film below (Japanese Patent Application Laid-Open No. 4-356967 (1992), pp. 3, FIG. 1 to 6, for example).

Furthermore, there is also a technique to form a metal film penetrating the oxide film from a side of the support substrate and reaching an under surface of the SOI layer and let off the heat generated in the SOI layer to the metal film (Japanese Patent Application Laid-Open No. 6-29376 (1994), pp. 4 to 6, FIGS. 1 to 7, for example). According to this method, the heat generated in the SOI layer is let off directly to the metal film without the oxide film or the support substrate, thus a high heat-radiating effect can especially be expected.

The high heat radiating effect can be expected by forming the metal film being directly in contact with the under surface of the SOI layer such as Japanese Patent Application Laid-Open No. 6-29376 described above. However, with regard to a recent SOI device with a view of a high-speed operation (high-speed SOI device), a source/drain diffusion layer in the transistor of the SOI layer has a structure reaching the under surface of the SOI layer. According to that, a junction capacitance in the source/drain diffusion layer is controlled to be low, thus the high-speed operation becomes possible. When the metal layer being in contact with the under surface of the SOI layer having such a structure is formed, a source and a drain of the transistor are shorted through the metal layer.

SUMMARY OF THE INVENTION

It is an object of the present invention to provide a semiconductor device which is also applicable to a high-speed SOI device and can obtain a high heat-radiating effect.

In the present invention, the semiconductor device includes a first insulating film, a silicon layer (SOI layer) formed on the first insulating film and that a semiconductor element is built, a second insulating film formed on the silicon layer, a first wiring formed on the second insulating film and a first plug connecting the semiconductor element with the first wiring.

According to a first aspect of the invention, the semiconductor device includes a predetermined back film formed under the first insulating film and a second plug connecting the first wiring with the back film. The first and second plugs, the first wiring and the back film have a higher thermal conductivity than that of the first insulating film.

A heat generated in the semiconductor element of the silicon layer is radiated to the back film having the high thermal conductivity through the first and second plugs and the first wiring all having the high thermal conductivity, in the same manner as the back film.

According to a second aspect of the invention, the semiconductor device includes a cooling element formed under the first insulating film and a second plug connecting the first wiring with the cooling element. The first and second plugs and the first wiring have a higher thermal conductivity than that of the first insulating film.

A heat generated in the semiconductor element of the silicon layer is radiated by the cooling element through the first and second plugs and the first wiring all having the high thermal conductivity.

According to a third aspect of the invention, the semiconductor device includes the first insulating film formed on the support substrate and a second plug which connects the first wiring with the support substrate and is extended into the support substrate. The first and second plugs, the first wiring and the support substrate have a higher thermal conductivity than that of the first insulating film.

A heat generated in the semiconductor element of the silicon layer is radiated to the support substrate having the high thermal conductivity through the first and second plugs and the first wiring all having the high thermal conductivity, in the same manner as the support substrate.

Therefore, the SOI device having the high heat radiating-effect can be obtained, and a self-heating effect in the SOI device can be controlled. The back film is connected with the semiconductor element of the SOI layer through the first and second plugs and first wiring, and is not in contact with an under surface of the SOI layer. Therefore, for example, even a transistor that the semiconductor element of the SOI layer has a source/drain diffusion layer reaching the under surface of the SOI layer does not generate a short-circuit between the source and the drain through the back film. That is to say, it is also applicable to the high-speed SOI device.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred Embodiment 1

Figure 1:
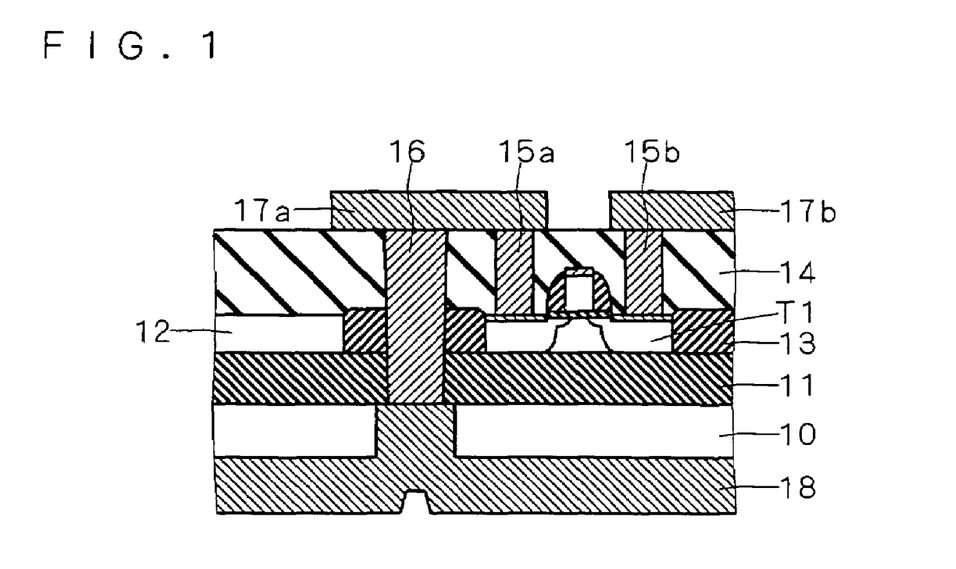
FIG. 1 is a drawing illustrating a composition of a semiconductor device according to a preferred embodiment 1.

FIG. 1 is a drawing illustrating a composition of a SOI device which is a semiconductor device according to the preferred embodiment 1. The SOI device has a SOI structure that a silicon layer (SOI layer) 12 is formed on a support substrate 10 made of silicon through a silicon oxide film 11 which is a first insulating film. A transistor T1 is formed in the SOI layer 12. A silicon oxide film 13 to insulate and separate a semiconductor element with the other one formed in the SOI layer 12 is formed in the SOI layer 12. A silicon oxide film 14 which is a second insulating film is formed on the SOI layer 12, and wirings 17a and 17b made of Aluminum (Al) are formed on the silicon oxide film 14. The wiring 17a which is a first wiring is connected with a source of the transistor T1 through a contact plug 15a which is a first plug made of Tungsten (W). The wiring 17b is connected with a drain of the transistor T1 through a contact plug 15b made of Tungsten. In the present preferred embodiment 1, it is supposed that the transistor T1 is a NMOS transistor, and the wiring 17a is a wiring connected with a ground (Gnd).

A back metal 18 made of a metal is formed as a back film on an under surface (back surface) of the support substrate 10. The back metal 18 is connected with the wiring 17a through a heat radiating plug 16 which is a second plug made of tungsten. Generally, any metal is known for having a high thermal conductivity. The back metal 18 is made of the metal which has a higher thermal conductivity than that of the silicon oxide films 11, 13 and 14 and the support substrate 10, and it is aluminum (Al), silver (Ag), gold (Au), titanium (Ti), tungsten (W), copper (Cu), a compound of them and so on, for example.

In the present preferred embodiment, a material of the contact plug 15a and the heat radiating plug 16 is described as tungsten, and a material of the wirings 17a and 17b is described as aluminum, however, other materials are also applicable if they have a higher thermal conductivity than that of the support substrate 10 and silicon oxide films 11, 13 and 14.

A heat generated in the transistor T1 formed in the SOI layer 12 is transmitted to the heat radiating plug 16 through the contact plug 15a and the wiring 17a and further radiated to the back metal 18 according to the composition as described above. The back metal 18 has the higher thermal conductivity than that of the support substrate 10, thus the higher heat-radiating effect can be obtained as compared with a case of letting off the heat generated in the transistor T1 to the support substrate 10. Therefore, a self-heating effect in the SOI device can be controlled.

Moreover, as recognized from FIG. 1, the back metal 18 is not in contact with an under layer of the transistor T1 formed in the SOI layer 12 (the silicon oxide film 11 is placed between the transistor T1 and the back metal 18). Therefore, even if the transistor T1 has a structure having a source/drain diffusion layer reaching the under surface of the SOI layer 12, it does not generate a short-circuit between the source and the drain through the back metal 18. That is to say, the present invention is also applicable to a high-speed SOI device.

Figure 2:
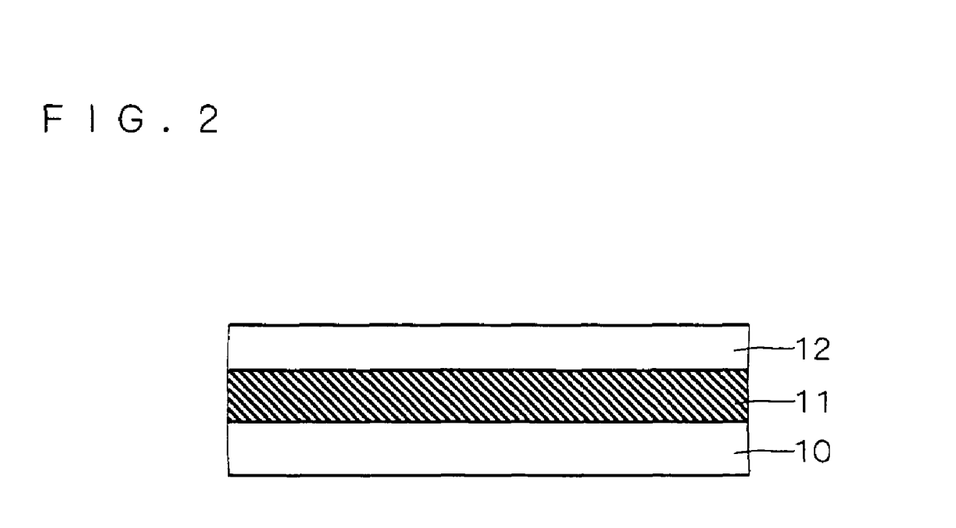
FIGS. 2 to 11 are drawings all illustrating a manufacturing process of the semiconductor device according to the preferred embodiment 1.

A manufacturing process of the semiconductor device illustrated in FIG. 1 is described hereinafter. First, a SOI wafer that the silicon oxide film 11 and the silicon layer (SOI layer) 12 are formed on the support substrate 10 made of silicon is prepared (FIG. 2). A thickness of the silicon oxide film 11 is approximately 10 to 300 nm, and a film thickness of the SOI layer 12 is approximately 50 to 500 nm in the SOI wafer.

Figure 3:
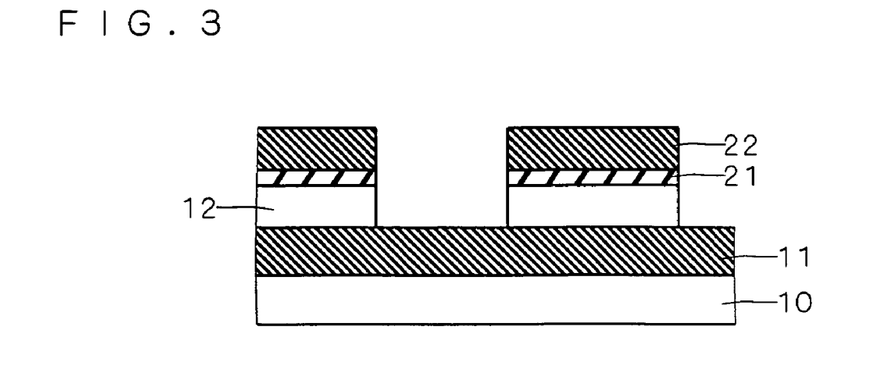
Figure 4:
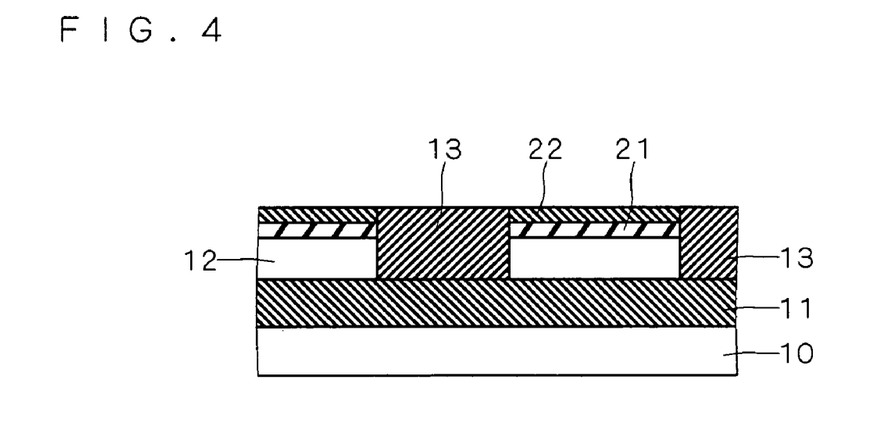

Moreover, a thermal oxide film (silicon oxide film) 21 of approximately 5 to 50 nm in thickness and a silicon nitride film (SiN) 22 of approximately 100 to 300 nm in thickness are deposited in order on an upper surface of the SOI layer 12. Next, a photoresist that a forming region of the silicon oxide film 13 which is an element isolation film is opened (not shown) is formed on the silicon nitride film 22, and with employing it as a mask, the SOI layer 12, the silicon oxide film 21 and the silicon nitride film 22 are etched (FIG. 3). As a result, an active region of the SOI layer 12 is patterned. The silicon oxide film 13 is deposited 100 to 500 nm in thickness, and a polishing is performed by a CMP (Chemical Mechanical Polishing) (FIG. 4).

Figure 5:
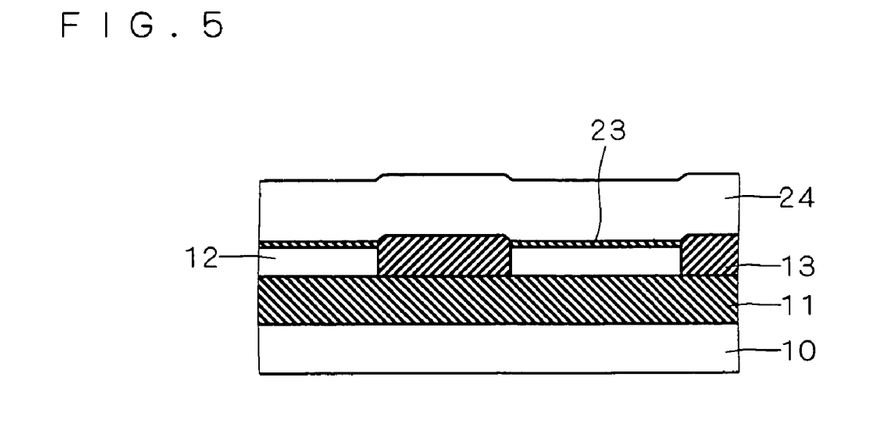

The silicon oxide film 21 and the silicon nitride film 22 are removed by a wet etching and a channel injection is performed to the SOI layer 12. The transistor T1 is the NMOS transistor, accordingly, an ion implantation of boron (B) which is a p type dopant, for example, is performed on condition that an injection energy is several dozen keV and a dose amount is $10^{12}$ to $10^{13}/cm^2$, approximately. After that, a gate oxide film 23 of several nm in thickness is formed on a surface of the SOI layer 12 by a thermal oxidation, and a polysilicon 24 is deposited 50 to 200 nm in thickness on it (FIG. 5).

Figure 6:
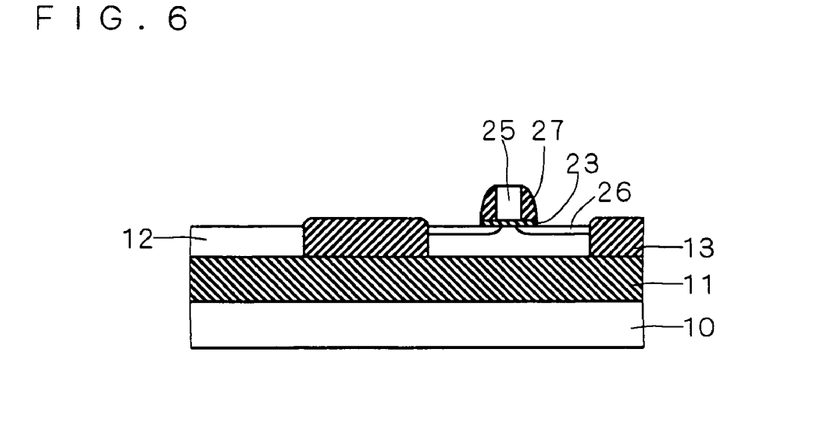

After a gate electrode 25 is formed by patterning the polysilicon 24 by a lithography technique, a LDD (Lightly Doped Drain) region 26 is formed by performing an ion implantation. The ion implantation of arsenic (As) which is a n type dopant, for example, is performed on condition that the injection energy is several keV and the dose amount is $10^{14}$ to $16^{15}/cm^2$, approximately. Moreover, a sidewall 27 is formed on a side surface of the gate electrode 25 by depositing a silicon oxide film approximately 10 to 100 nm in thickness and performing an etch-back to it (FIG. 6).

Figure 7:
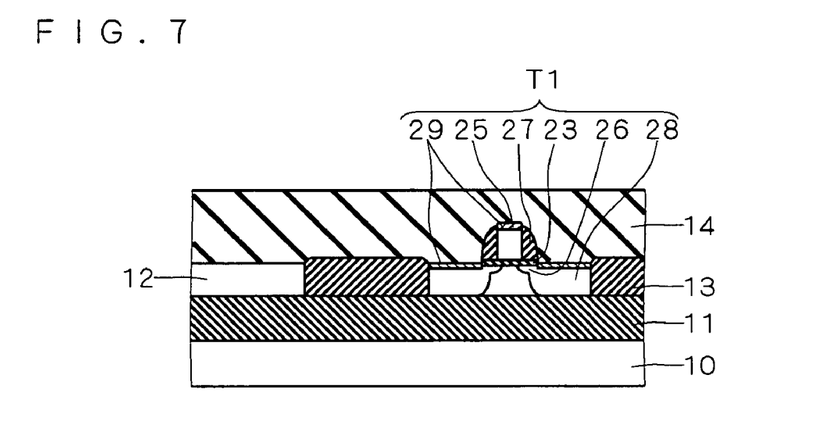

After forming the sidewall 27, a source/drain region 28 is formed by performing an ion implantation. The ion implantation of As which is the n type dopant, for example, is performed on condition that the injection energy is several dozen keV and the dose amount is $10^{15}$ to $10^{16}/cm^2$, approximately. In case that the transistor T1 is a transistor with a view of a high-speed operation, the source/drain region 28 is formed to reach the under surface of the SOI layer 12. Upper surfaces of the gate electrode 25 and the source/drain region 28 are silicidized. According to that, the transistor T1 composed of the gate oxide film 23, the gate electrode 25, the LDD region 26, the sidewall 27, the source/drain region 28 and a silicide 29 is formed in the SOI layer 12. After that, the silicon oxide film 14 is deposited approximately 500 to 1000 nm in thickness on the transistor T1, and the upper surface of it is flatted by the CMP (FIG. 7).

Figure 8:
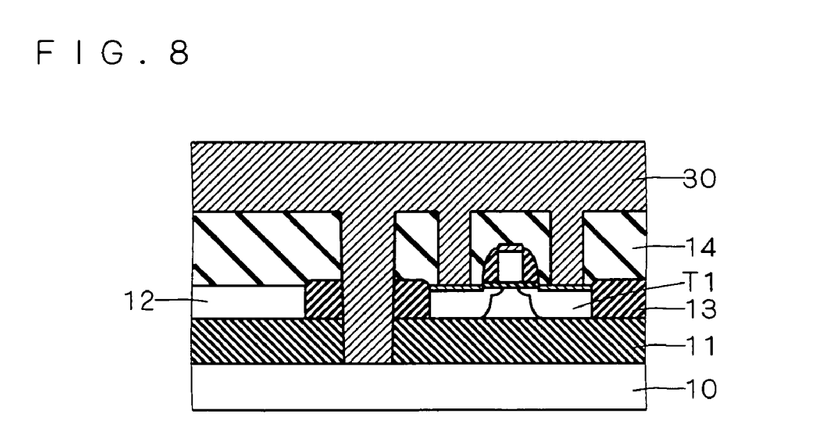

Next, by the lithography technique, an opening reaching the support substrate 10 through the silicon oxide films 11, 13 and 14 is formed in a region where the heat radiating plug 16 is formed, and moreover, a contact hole reaching the source and the drain of the transistor T1 is formed in a region where the contact plugs 15a and 15b of the silicon oxide film 14 are formed. A tungsten 30 is deposited to fill up the opening and contact hole (FIG. 8).

Figure 9:
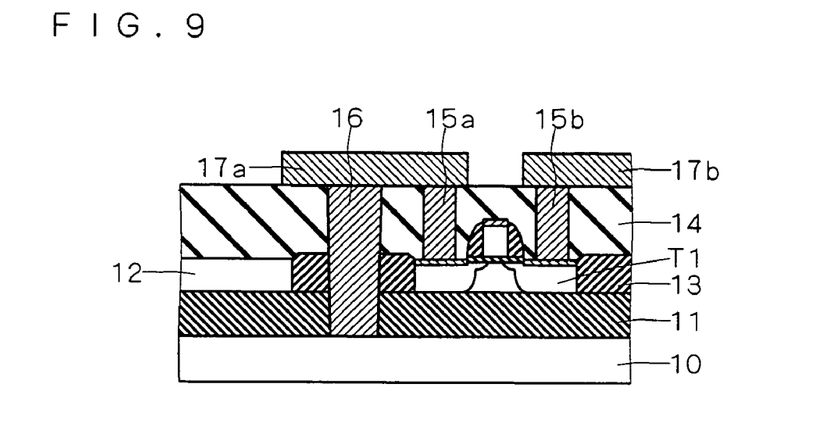

After that, the tungsten 30 placed on an upper surface of the silicon oxide film 14 is removed, and the contact plugs 15a and 15b are formed. Moreover, aluminum is deposited approximately 100 to 500 nm in thickness on the silicon oxide film 14 and is patterned, and the wiring 17a connected with the contact plug 15a and the heat radiating plug 16 and the wiring 17b being in contact with the contact plug 15b are formed, respectively (FIG. 9).

Figure 10:
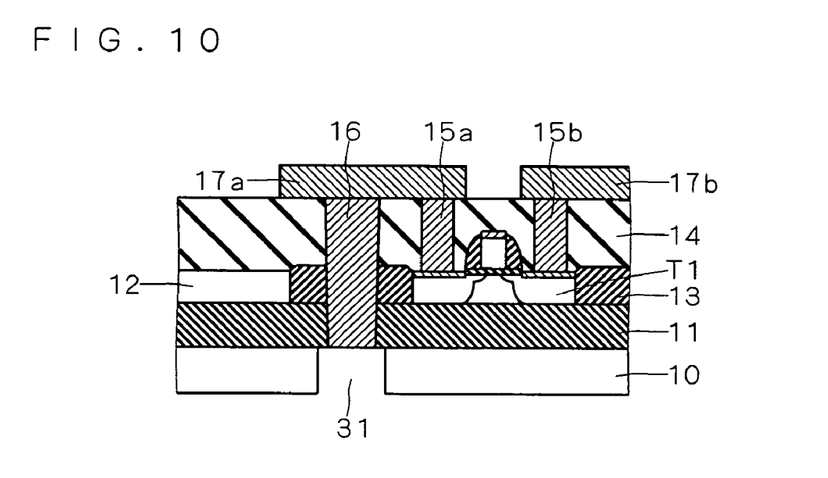

An opening part 31 is formed to expose the heat radiating plug 16 in the support substrate 10. A formation of the opening part 31 is performed by forming a patterned photoresist on the back surface of the support substrate 10 and employing it as a mask, performing the wet etching or a dry etching to the support substrate 10 (FIG. 10).

Finally, the back metal 18 is formed with depositing a predetermined metal having the higher thermal conductivity than that of the support substrate 10 (Al, Ag, Au, Ti, W, Cu and so on) approximately several μm to 10 mm in thickness on the back surface of the support substrate 10. The semiconductor device illustrated in FIG. 1 is formed through the process described above.

In the meantime, the description described above is on the assumption that the transistor T1 is the NMOS transistor, however, the transistor T1 can also be a pMOS transistor. In that case, the wiring 17a which the source of the transistor T1 is connected with through the contact plug 15a should be a wiring connected with a power source (Vdd).

In case that the transistor T1 is the pMOS transistor, a modification as described hereinafter is necessary in the manufacturing process described above. First, after the process illustrated in FIG. 4 followed by the removal of the silicon oxide film 21 and the silicon nitride film 22, the ion implantation of arsenic which is the n type dopant, for example, is performed on condition that the injection energy is several dozen keV and the dose amount is $10^{12}$ to $10^{13}/cm^2$, approximately, when performing the channel injection to the SOI layer 12. Moreover, in the process illustrated in FIG. 6, the ion implantation of boron which is the p type dopant, for example, is performed on condition that the injection energy is several keV and the dose amount is $10^{14}$ to $10^{15}/cm^2$, approximately, when forming the LDD region 26. Furthermore, in the process illustrated in FIG. 7, the ion implantation of boron which is the p type dopant, for example, is performed on condition that the injection energy is several keV and the dose amount is $10^{15}$ to $10^{16}/cm^2$, approximately, when forming the source/drain region 28. According to that, the transistor T1 is formed as the pMOS transistor.

Besides, the description is on the assumption that the wiring 17a is a wiring connected with the Gnd or the Vdd, however, it can also be other wiring connected with a semiconductor element formed in the SOI layer 12 (a signal line, for example). Also in that case, the high heat-radiating effect can be obtained. In this regard, when the wiring 17a is the wiring connected with the Gnd or the Vdd, it can be easy to make plural elements share the back metal 18 and raise the heat-radiating effect among the plural elements.

Figure 11:
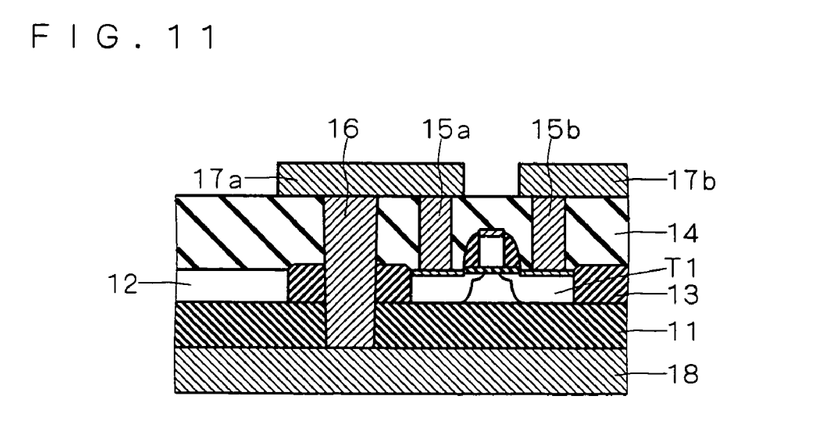

Furthermore, in the process described in FIG. 10, the opening part 31 is formed with removing a part of the support substrate 10, however, all of the support substrate 10 can be removed, too. As a result, the SOI device comes to have a structure that an entire under surface of the silicon oxide film 11 is in contact with the back metal 18 as shown in FIG. 11. In that case, it is not necessary to form the photoresist when removing the support substrate 10, and a simplification of the manufacturing process is attainable. The back metal 18 has the higher thermal conductivity than that of the support substrate 10, thus the higher heat-radiating effect can be obtained.

Preferred Embodiment 2

As illustrated in FIG. 11 described in the preferred embodiment 1, the manufacturing method is simplified and the high heat-radiating effect can be obtained by removing the entire support substrate 10. However, in case that the SOI device has a circuit region having elements such as a transistor, an inductor, a resistance, a varactor and so on, it is considered that a signal loss in the elements of the circuit region becomes large (that is to say, a Q factor drops) caused by an electrostatic induction, if the support substrate 10 on a bottom of the circuit region is removed and the back metal 18 is formed directly on the under surface of the silicon oxide film 11.

Figure 12:
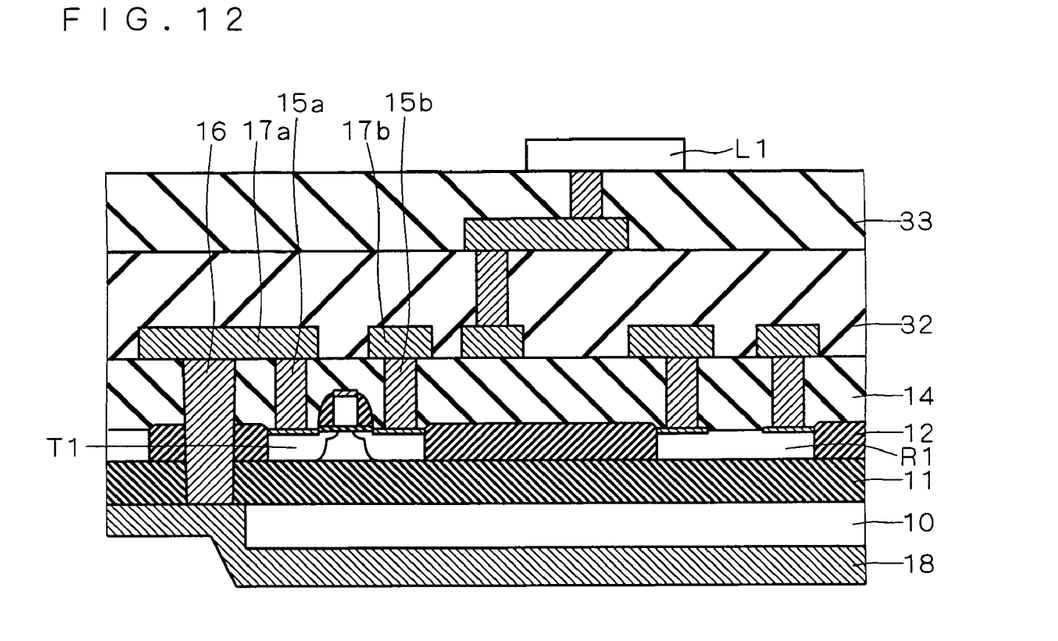
FIG. 12 is a drawing illustrating a composition of a semiconductor device according to a preferred embodiment 2.

FIG. 12 is a drawing illustrating a composition of a SOI device which is a semiconductor device according to the preferred embodiment 2. In this drawing, signs identical with that in FIG. 1 are put on elements similar to that in FIG. 1, thus a detailed description is omitted here. The SOI device has a circuit region in which elements such as a resistance element R1, an inductor L1, a varactor (not shown) and so on is formed in addition to the transistor T1 and has the support substrate 10 on a bottom of it. The support substrate 10 is made of silicon and has a higher resistance than that of the back metal 18. Accordingly, the signal loss in the elements and so on such as the transistor T1, the resistance element R1, the inductor L1, the varactor and so on is controlled in the SOI device according to the present invention.

The support substrate 10 is removed at least in a part of a bottom of the heat radiating plug 16 so that the heat radiating plug 16 and the back metal 18 are in contact with each other. That is to say, the transistor T1 is connected with the back metal 18 through the contact plug 15a, the wiring 17a and the heat radiating plug 16, in the same manner as the preferred embodiment 1. The back metal 18 is not in contact with the under surface of the transistor T1 formed in the SOI layer 12.

Therefore, the high heat-radiating effect can be obtained in the same manner as the preferred embodiment 1, and moreover, it is also applicable to the high-speed SOI device.

Preferred Embodiment 3

Figure 13:
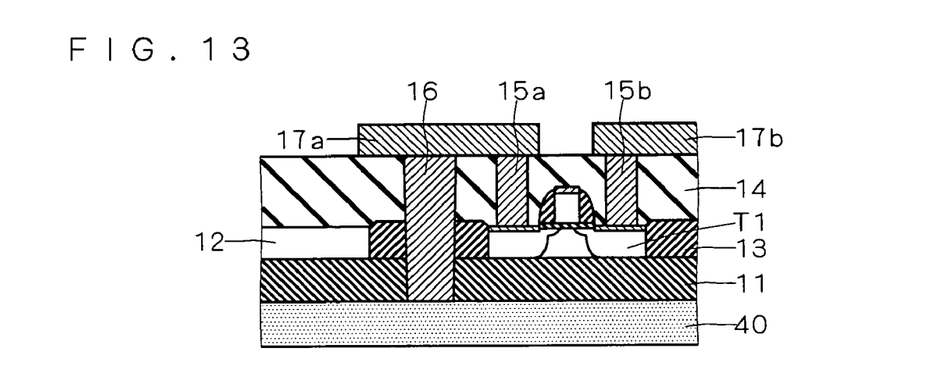
FIGS. 13 and 14 are drawings both illustrating a composition of a semiconductor device according to a preferred embodiment 3.

FIG. 13 is a drawing illustrating a composition of a SOI device which is a semiconductor device according to the preferred embodiment 3. In this drawing, signals identical with that in FIG. 1 are put on elements similar to that in FIG. 1. As illustrated in FIG. 13, the SOI device includes a cooling element 40 instead of the back metal 18 in the SOI device according to the preferred embodiment 1 or the preferred embodiment 2. It can also include the support substrate 10 in a predetermined position (for example, a bottom of the elements such as the transistor, the inductor, the resistance, the varactor and so on), although an illustration in FIG. 13 is omitted.

Figure 14:
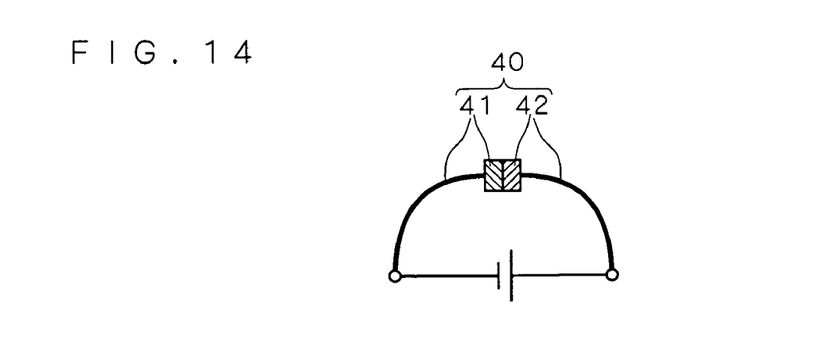
Figure 15:
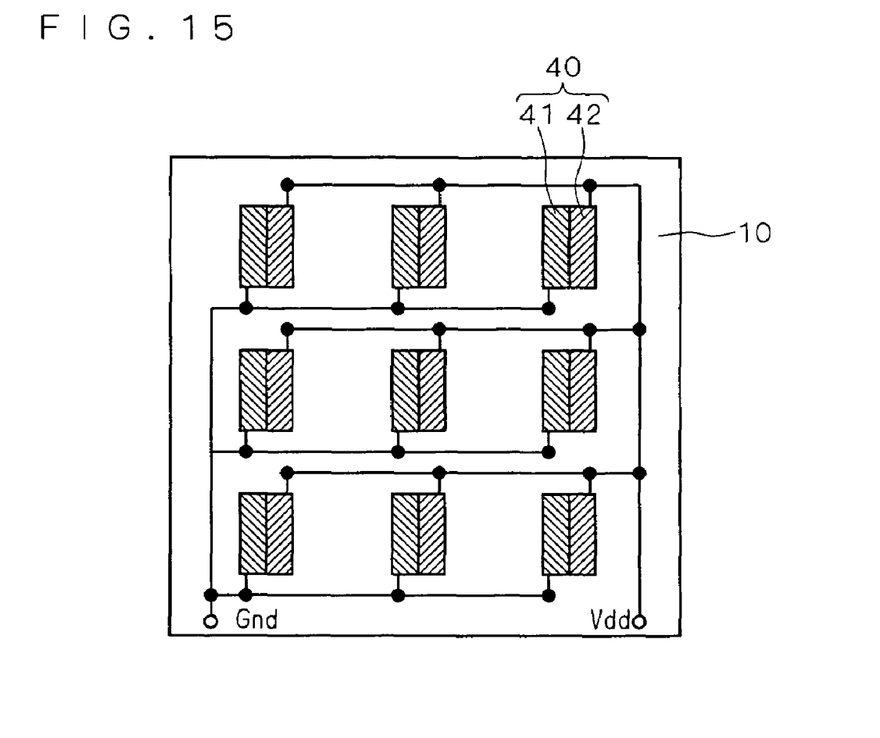
FIG. 15 is a drawing illustrating an example of a placing method of a cooling element in the semiconductor device according to the preferred embodiment 3.

A Peltier cooling element is noticed as the cooling element 40. For example, when an electric current flows with connecting a copper 41 with a constantan 42 as illustrated in FIG. 14, an absorption of a heat occurs at its junction. The Peltier cooling element is that this effect is employed for a cooling action. FIG. 15 is an example of a placing method of the Peltier cooling element in case of employing the Peltier cooling element as the cooling element 40, and a plane view of a back surface of the SOI device according to the present preferred embodiment. As illustrate in FIG. 15, the copper 41 is placed to be connected with a low potential side (Gnd side) and the constantan 42 is placed to be connected with a high potential side (Vdd side) in the respective cooling elements 40. In case of employing the Peltier cooling element for the cooling element 40, it is preferable to insulate the heat-radiating plug 16 from the copper 41 and the constantan 42 so that the current flowing in the cooling element 40 does not have influence on an operation of the SOI device.

According to the present preferred embodiment, the even higher heat-radiating effect can be obtained than that according to the preferred embodiment 1 and the preferred embodiment 2.

Figure 27:
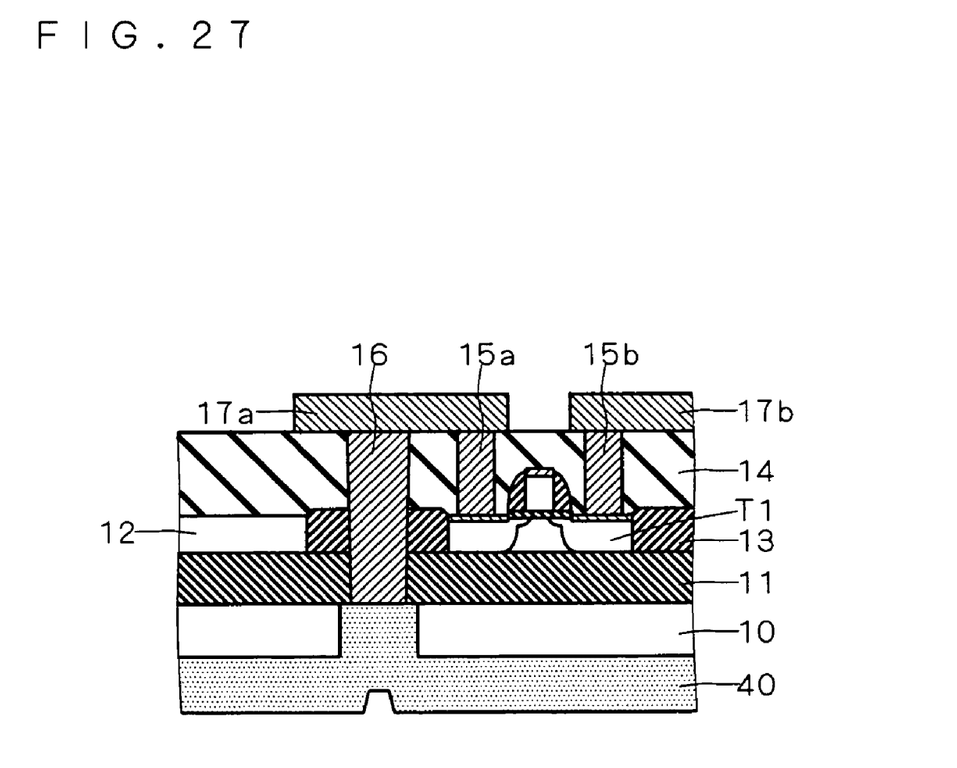
FIG. 27 is a drawing illustrating a modified example according to the preferred embodiment 3.

Although the present preferred embodiment describes a structure where the support substrate 10 of a SOI device is entirely removed, a part of the support substrate 10 may be left as illustrated in FIG. 27. For example, in case that the cooling element 40 is a Peltier cooling element formed by metal (copper and constantan) and the SOI device has a circuit region having elements such as a transistor, an inductor, a resistance, a varactor and so on, a signal loss in the elements of the circuit region might become large due to an electrostatic induction. Similarly to the preferred embodiment 2, if the support substrate 10 having a higher resistance than that of the metal of the Peltier cooling element is provided on a bottom of the circuit region, such signal loss in the elements can be restrained.

Preferred Embodiment 4

A composition including the heat radiating plug 16 (the second plug) to improve the heat radiation separately from the contact plug 15a (the first plug) necessary to the operation of the SOI device as FIG. 1, for example, is described in the preferred embodiments 1 to 3. However, both the contact plug 15a and the heat radiating plug 16 are connected with the identical wiring 17a, thus a problem does not occur on the operation of the device even if they are integrated and formed as an identical plug.

Figure 16:
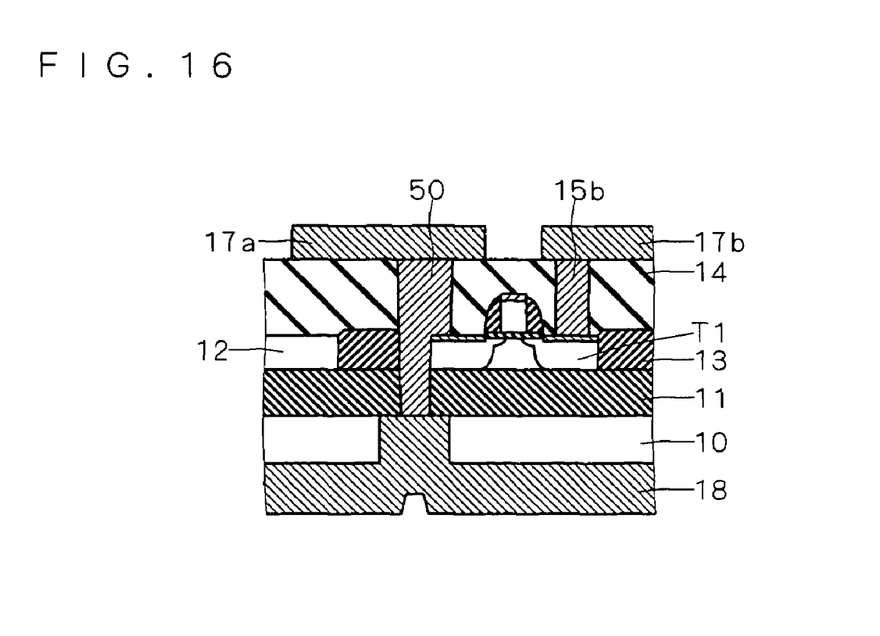
FIG. 16 is a drawing illustrating a composition of a semiconductor device according to a preferred embodiment 4.

FIG. 16 is a drawing illustrating a composition of a SOI device which is a semiconductor device according to the preferred embodiment 4. In this drawing, signals identical with that in FIG. 1 are put on elements similar to that in FIG. 1. As illustrated in FIG. 16, the SOI device includes a contact plug 50 that the contact plug 15a and the wiring 17a are integrated (called "heat radiating contact plug 50" hereinafter) instead of the contact plug 15a and the wiring 17a themselves in the respective preferred embodiments described above. That is to say, the heat radiating contact plug 50 connects three parts, that is, the transistor T1, the wiring 17a and the back metal 18 (the cooling element 40 in case of applying to the preferred embodiment 2) with one another, and has both functions that the contact plug 15a and the wiring 17a have.

According to the present preferred embodiment, it is not necessary to place the contact plug 15a and the heat radiating plug 16 separately as the preferred embodiments 1 to 3, thus a miniaturization of the SOI device according to the present invention is attainable. The heat generated in the transistor T1 is transmitted to the back metal 18 (or the cooling element 40) through three parts, that is, the contact plug 15a, the wiring 17a and the heat radiating plug 16 in the preferred embodiments 1 to 3, however, it is transmitted through the mere heat radiating contact plug 50. That is to say, a route which the heat generated in the transistor T1 reaches the back metal 18 (the cooling element 40) through is shortened, thus the higher heat-radiating effect can be obtained.

Preferred Embodiment 5

Figure 17:
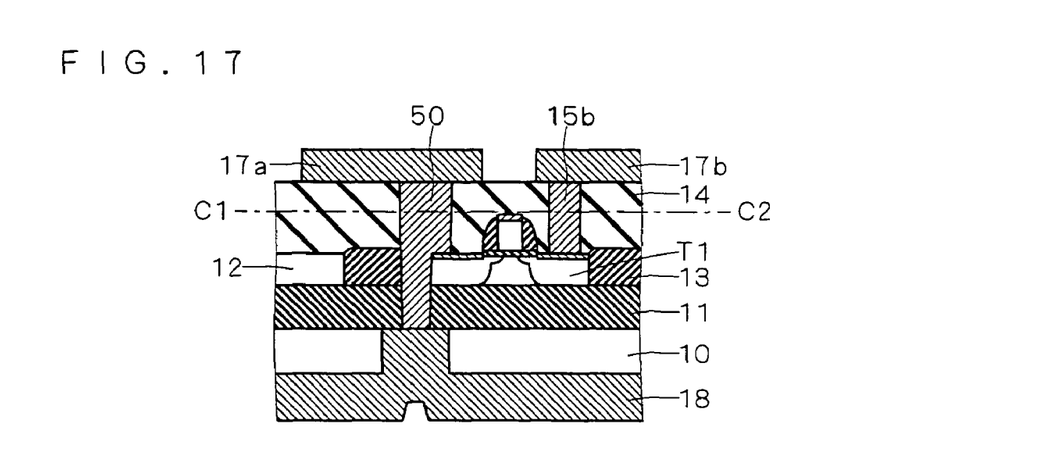
FIGS. 17 to 19 are drawings all illustrating a composition of a semiconductor device according to a preferred embodiment 5.
Figure 18:
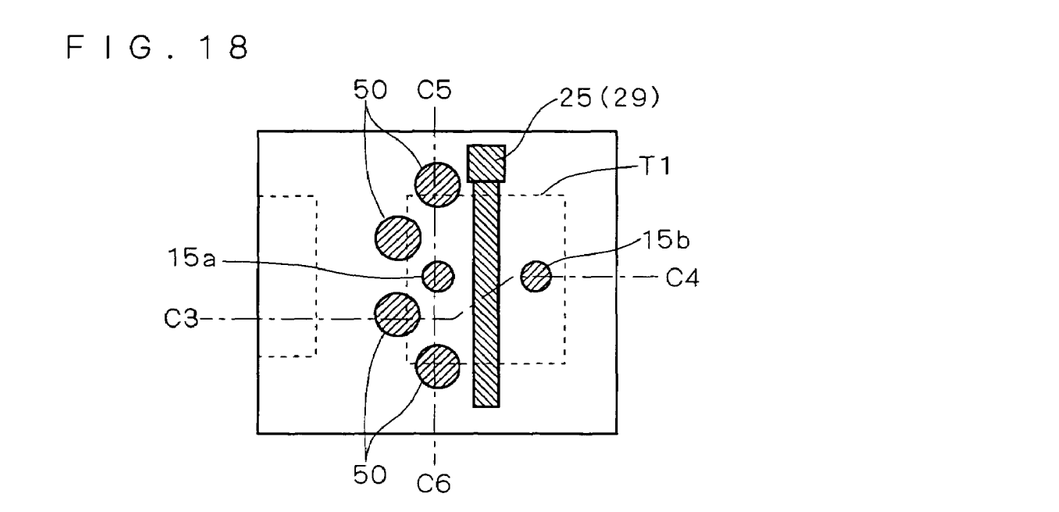
Figure 19:
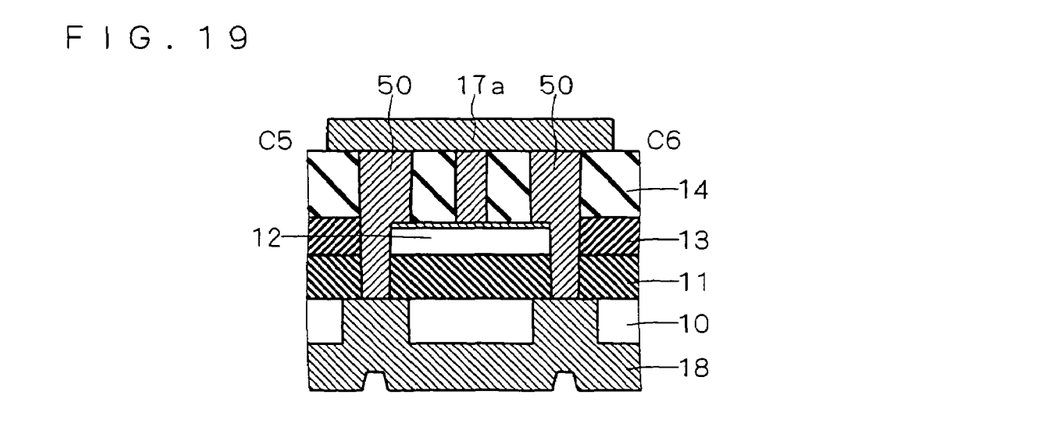

The plural heat radiating plugs 16 and/or the heat radiating contact plugs 50 are placed for one transistor T1 in the present preferred embodiment. FIGS. 17 to 19 are drawings all illustrating a composition of a SOI device which is a semiconductor device according to the preferred embodiment 5. In these drawings, signals identical with that in FIG. 1 and FIG. 16 are put on elements similar to that in FIG. 1 and FIG. 16.

FIG. 18 is an upper cross-sectional surface along a C1-C2 line in FIG. 17. The plural heat radiating contact plugs 50 connected with the transistor T1 are formed. The last FIG. 17 corresponds to a cross-sectional view along a C3-C4 line in FIG. 18. Furthermore, a cross-sectional view along a C5-C6 line in FIG. 18 is illustrated in FIG. 19. The respective heat radiating contact plugs 50 connect the three parts, that is, the transistor T1, the wiring 17a and the back metal 18 (or the cooling element 40) with one another.

According to the present preferred embodiment, the route that the heat generated in the transistor T1 reaches the back metal 18 (the cooling element 40) through increases, thus the higher heat-radiating effect can be obtained. Besides, the heat radiating plug 16 is not illustrated in FIGS. 17 to 19, however, a composition including the plurality of it is also applicable. Moreover, the number of the contact plug 15a can increase to be plural.

Preferred Embodiment 6

The description is on the assumption that the wiring 17a with which the back metal 18 is electrically connected is mainly connected with the ground (Gnd) or the power source (Vdd) in the preferred embodiment 1. For example, in case that the back metal 18 is formed on the entire back surface of the SOI device, the back metal 18 cannot be shared between the Gnd and the Vdd. The reason is of it that the Vdd and the Gnd are shorted through the back metal 18. According to that, even in case that the SOI device has both the NMOS transistor and the pMOS transistor, the present invention is applicable only to one type of the transistor out of those transistors.

Figure 20:
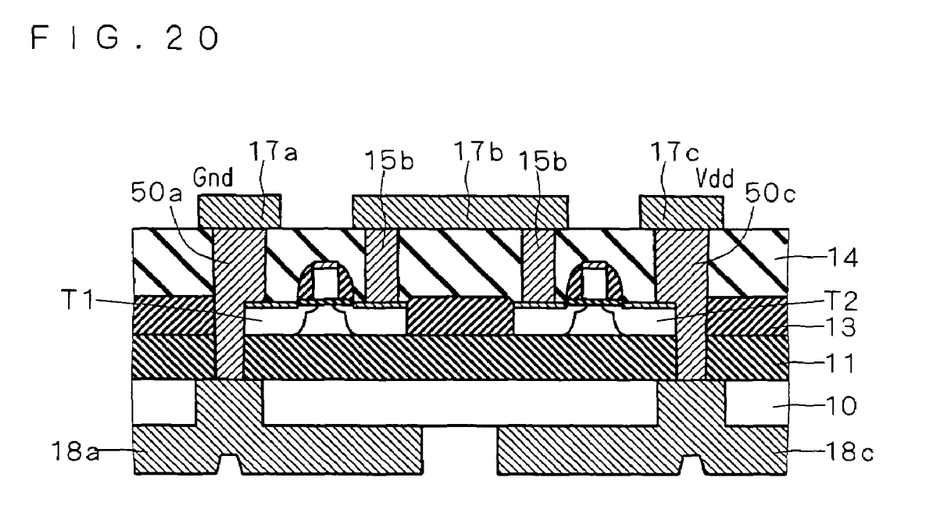
FIG. 20 is a drawing illustrating a composition of a semiconductor device according to a preferred embodiment 6.

The back metal 18 is placed separately in a part connected electrically with the Gnd and a part connected with the Vdd in the present preferred embodiment. FIG. 20 is a drawing illustrating a composition of a SOI device which is a semiconductor device according to the preferred embodiment 6. In this drawing, signals identical with that in FIG. 1 and FIG. 16 are put on elements similar to that in FIG. 1 and FIG. 16.

The SOI device has the transistor T1 which is the nMOS transistor and a transistor T2 which is the pMOS transistor. A source of the nMOS transistor T1 is connected with the wiring 17a connected with the Gnd and a back metal 18a through a heat radiating contact plug 50a. A source of the pMOS transistor T2 is connected with a wiring 17c connected with the Vdd and a back metal 18c through a heat radiating contact plug 50c. The back metal 18a and the back metal 18c are separated from each other, and are not electrically connected with each other. That is to say, the SOI device according to the present preferred embodiment has the back metal 18a of the Gnd potential and the back metal 18c of the Vdd potential.

A formation of the back metals 18a and 18c is performed by forming the back metal 18 according to the manufacturing process described in the preferred embodiment 1 (FIG. 1) and after that, patterning the back metal 18 and dividing it into the back metals 18a and 18c. Besides, a composition that a part of the support substrate 10 is removed is illustrated in FIG. 20, however, a composition that the entire support substrate 10 is removed is also applicable.

According to the present preferred embodiment, the back metals 18a and 18c are not electrically connected with each other, thus the Vdd and the Gnd are not shorted through them. Therefore, it is possible to apply the present invention to both the nMOS transistor T1 and the pMOS transistor T2 and raise the heat-radiating effect in the same manner as the preferred embodiment 1.

A composition including the two types of the back metal, that is, the back metal 18a for the Gnd and the back metal 18c for the Vdd is described in the above description, however, an application of the present invention is not limited to this. An additional back metal for a predetermined signal line separated from the back metal 18a and the back metal 18c and so on can also be placed. According to that also, the high heat-radiating effect can similarly be obtained.

Preferred Embodiment 7

Figure 21:
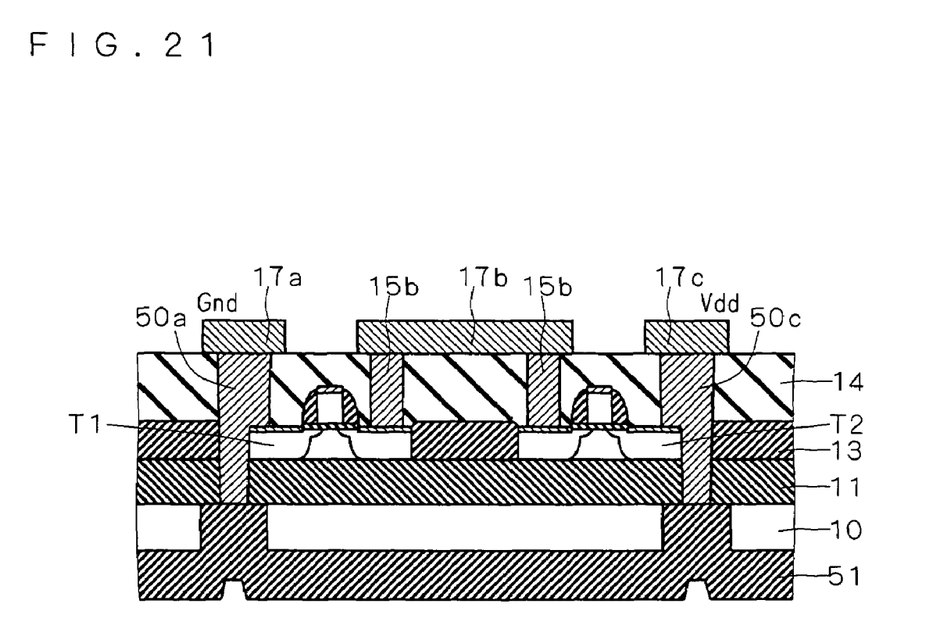
FIG. 21 is a drawing illustrating a composition of a semiconductor device according to a preferred embodiment 7.

FIG. 21 is a drawing illustrating a composition of a SOI device which is a semiconductor device according to the preferred embodiment 7. In this drawing, signals identical with that in FIG. 20 are put on elements similar to that in FIG. 20. The SOI device includes a radiator 51 which has the higher thermal conductivity than that of the support substrate 10 (silicon) and moreover, is an insulator or a semiconductor of high resistance (that is to say, except for a conductor) instead of the back metals 18a and 18c in the SOI device according to the preferred embodiment 6. As a material of the radiator 51, aluminum nitride (AlN) and alumina (Al 2O3) are noticed as the insulator and high concentration polysilicon and so on are noticed as the semiconductor device, for example.

The radiator 51 has the high thermal conductivity, thus the nMOS transistor T1 and the pMOS transistor T2 can raise the heat-radiating effect in the same manner as the preferred embodiment 1. Moreover, the radiator 51 is composed of the material except for the conductor, thus even if the radiator 51 is formed on the entire back surface of the SOI device and the radiator 51 is shared between the Gnd and the Vdd, for example, the Gnd and the Vdd are not shorted. Accordingly, the heat-radiating effect can be raised with applying the present invention to both the NMOS transistor T1 and the pMOS transistor T2 in the same manner as the preferred embodiment 6.

A signal line except for the Gnd and the Vdd can be connected with the radiator 51, for example. According to that, the heat-radiating effect can further be raised. Even in that case, it goes without saying that a short-circuit between the signal lines does not occur.

In the preferred embodiment 6, a process to pattern the back metal 18 after forming it once is necessary to separate the back metal 18a connected with the Gnd from the back metal 18c connected with the Vdd as described above. However, the radiator 51 in the present preferred embodiment is the insulator or the semiconductor of high resistance, thus the effect described above can be obtained without patterning it.

A composition removing a part of the support substrate 10 is illustrated in FIG. 21, however, a composition removing the entire support substrate 10 can also be applicable. As described above, in case of forming the back metal 18 directly on the under surface of the silicon oxide film 11 with removing the support substrate 10 on the bottom of the elements such as the transistor, the inductor, the resistance the varactor and so on, it is concerned that the signal loss in those elements becomes large caused by the electrostatic induction. However, in the present preferred embodiment, even if the entire support substrate 10 is removed, such a problem is not involved by reason that the radiator 51 which is not the conductor is that which is formed on the bottom of the silicon oxide film 11.

Preferred Embodiment 8

Figure 22:
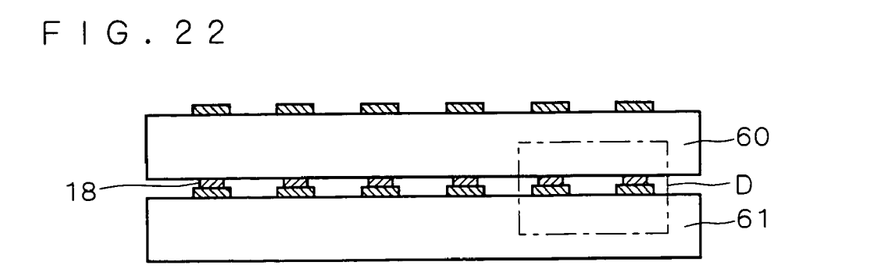
FIGS. 22 and 23 are drawings both illustrating a composition of a semiconductor device according to a preferred embodiment 8.
Figure 23:
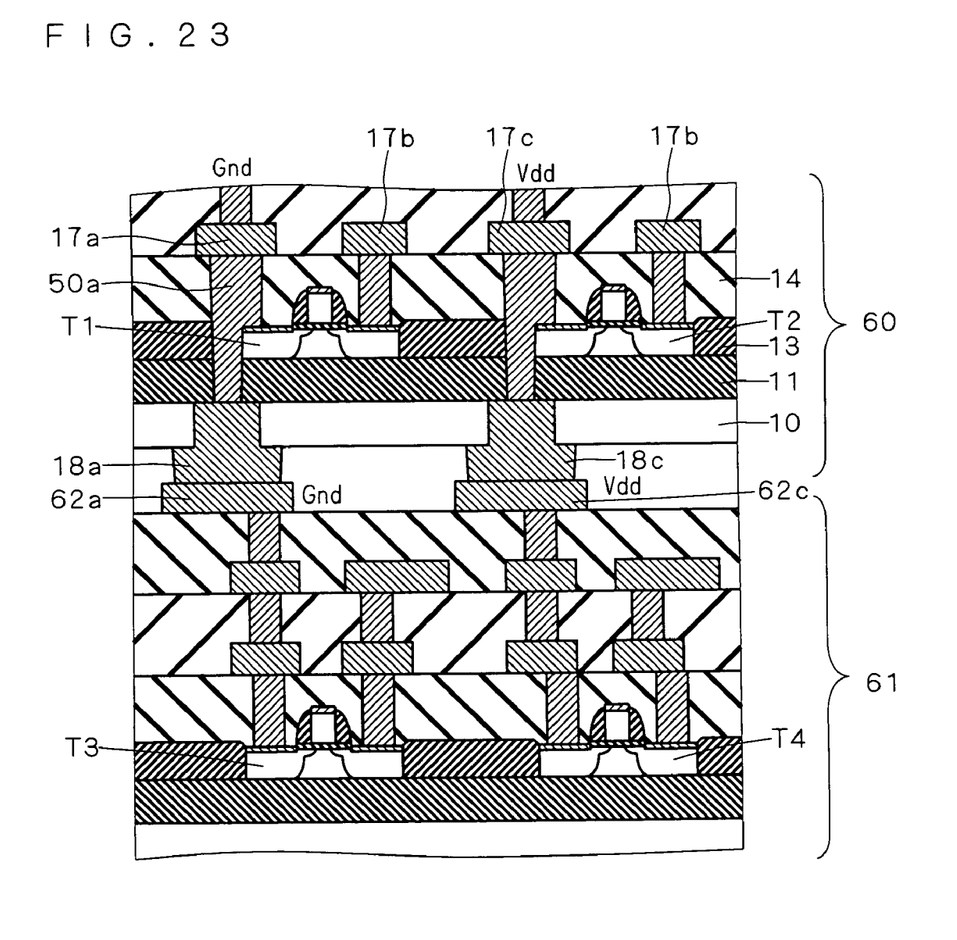

FIG. 22 and FIG. 23 are drawings both illustrating a composition of a semiconductor device according to the preferred embodiment 8. In the present preferred embodiment, a chip 60 according to the present invention is stuck on and connected with other chip 61 through the back metal 18 as illustrated in FIG. 22. A heat generated in the chip 60 can be radiated to the chip 61 by connecting the chip 60 which has a large heating value according to the present invention, for example, with the chip 61 which has a small consumed power and small heating value such as a SRAM, a flash memory and so on, for example, and a rise in temperature as the whole semiconductor device is controlled.

FIG. 23 is an enlarged section view of a region D illustrated in FIG. 22. In this drawing, signals identical with that in FIG. 20 are put on elements similar to that in FIG. 20. In this example, transistors T1 and T3 in the chip 60 are the nMOS transistors, and transistors T2 and T4 in the chip 61 are the pMOS transistors.

The wiring 17a, the heat radiating contact plug 50a and the back metal 18a are connected with the source of the nMOS transistor T1 and the Gnd. The wiring 17c, the heat radiating contact plug 50c and the back metal 18c are connected with the source of the pMOS transistor T2 and the Vdd. A pad 62a in the chip 61 is connected with a source of the NMOS transistor T3 and the Gnd. A pad 62c is connected with a source of the pMOS transistor T4 and the Vdd. Accordingly, the back metal 18a and the pad 62a both connected with the Gnd are connected with each other, and the back metal 18c and the pad 62c both connected with the Vdd are connected with each other so that the Gnd and the Vdd are not shorted between the two chips 60 and 61 as illustrated in FIG. 23.

In this regard, it is obvious that the radiator 51 can be shared between the Gnd (the pad 62a) and the Vdd (the pad 62c) of the chip 61, in case that the chip 60 has the radiator 51 composed of the material except for the conductor instead of the back metals 18a and 18c as the preferred embodiment 7. Moreover, a composition removing a part of the support substrate 10 is illustrated as the chip 60 in FIG. 23, however, a composition removing the entire support substrate 10 is also applicable.

Preferred Embodiment 9

Figure 24:
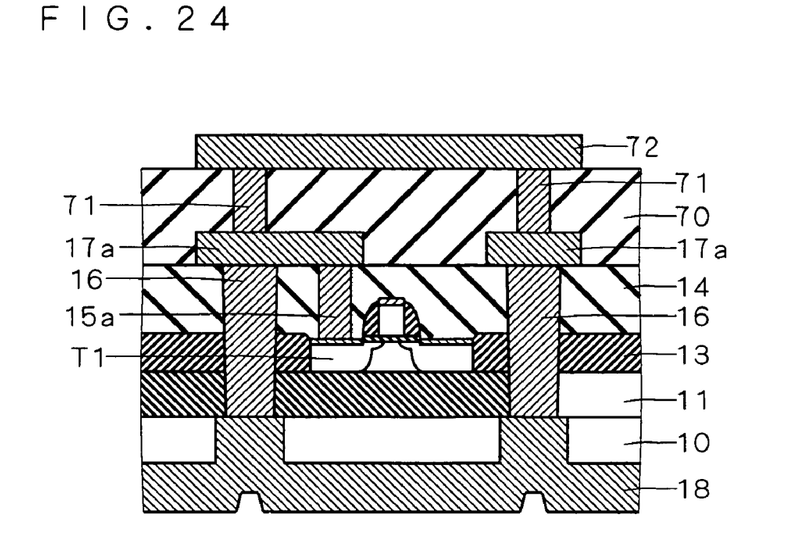
FIGS. 24 and 25 are drawings both illustrating a composition of a semiconductor device according to a preferred embodiment 9.
Figure 25:
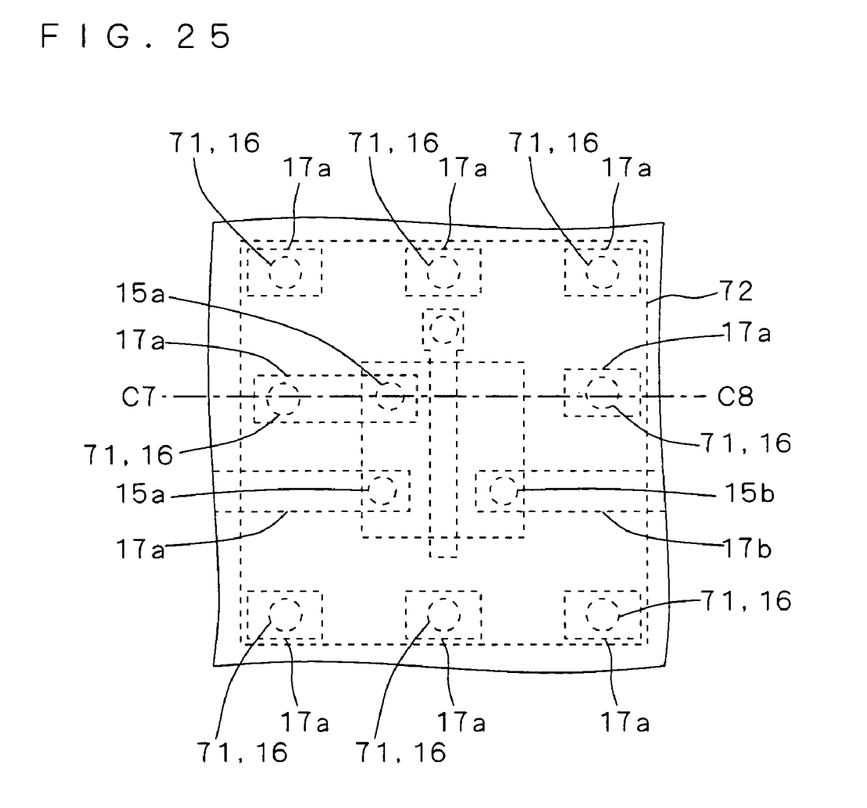

FIG. 24 and FIG. 25 are drawings both illustrating a composition of a SOI device which is a semiconductor device according to the preferred embodiment 9. In these drawings, signals identical with that in FIG. 1 are put on elements similar to that in FIG. 1. In FIG. 24, the transistor T1 is the NMOS transistor, and contact plugs 15a and 71, the heat radiating plug 16, the wiring 17a, the back metal 18 and a wiring 72 are connected with the source of the transistor T1 and the Gnd.

Moreover, FIG. 25 is an upper surface view of the SOI device illustrated in FIG. 24. FIG. 24 corresponds to a cross-sectional view along a C7-C8 line illustrated in FIG. 25. The wiring 72 which is a second wiring is formed to cover from above the transistor T1, and the back metal 18 is formed on the entire surface of the bottom of the transistor T1. The wiring 72 and the back metal 18 are connected with each other through the plural contact plugs 71, wirings 17a and heat radiating plugs 16. That is to say, the SOI device has a structure that the head and the bottom of the transistor T1 are covered with a metal (so-called "a microstrip structure"). Accordingly, a radiation of an electromagnetic wave noise occurred in the transistor T1 can be controlled. It goes without saying that the high heat-radiating effect can be obtained in the same manner as the preferred embodiment 1.

Preferred Embodiment 10

A technique to let off the heat generated in the SOI layer to the support substrate made of silicon by forming the trench insulation and the contact, reaching the support substrate, for the heat radiation is suggested as described above. In the present preferred embodiment, a structure of a SOI device to apply the present invention to the technique and obtain the further high heat-radiating effect.

Figure 26:
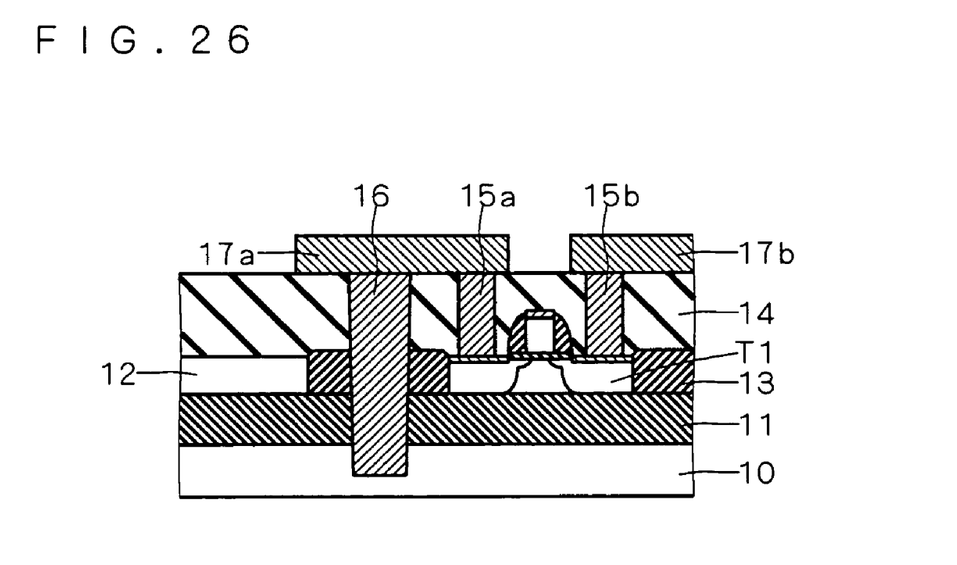
FIG. 26 is a drawing illustrating a composition of a semiconductor device according to a preferred embodiment 10.

FIG. 26 is a drawing illustrating the structure of the SOI device which is a semiconductor device according to the preferred embodiment 10. In this drawing, signal identical with that in FIG. 1 are put on elements similar to that in FIG. 1. The heat radiating plug 16 that the SOI device according to the present preferred embodiment has sticks out to the bottom through the silicon oxide film 11 and intrudes into the support substrate 10 approximately several dozen to several hundred nm as shown in FIG. 26. According to that, a contact area between the heat radiating plug 16 and the support substrate 10 becomes large, thus the heat generated in the transistor T1 can effectively be radiated to the support substrate. Silicon forming the support substrate 10 has the higher thermal conductivity than that of the silicon oxide film 11, thus the high heat-radiating effect can be obtained.

A composition that the heat radiating plug 16 separated from the contact plug 15a sticks out to the support substrate 10 is illustrated in FIG. 26, however, an application of the present preferred embodiment is not limited to this composition. A composition that a plug that the contact plug 15a and the heat radiating plug 16a are integrated with each other, that is to say, the heat radiating contact plug 50 described in the preferred embodiment 4 intrudes into the support substrate 10 is also applicable, for example.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
a first insulating film;
a silicon layer formed on said first insulating film and in which a semiconductor element is built;
a second insulating film formed on said silicon layer and said semiconductor element;
a first wiring formed on said second insulating film and connected to ground;
a first plug connecting a source of a MOS transistor of said silicon layer with said first wiring;
a predetermined back metal film formed under said first insulating film;
a second plug connecting said first wiring with said back metal film; and
a support substrate composed of a material of higher resistance than that of said back metal film in a predetermined position between said first insulating film and said back metal film, wherein
said first and second plugs, said wiring and said back metal film have a higher thermal conductivity than that of said first insulating film;
said semiconductor element is the MOS transistor;
only said second plug that is connected with the source of said MOS transistor is connected with said back metal film;
said semiconductor device is formed with a first semiconductor chip and a second semiconductor chip;
said first semiconductor chip and said second semiconductor chip are different from each other in power consumption;
said back metal film of said first semiconductor chip is connected with a protruding pad of said second semiconductor chip; and
there is an interspace between said first semiconductor chip and said second semiconductor chip.

2. The semiconductor device according to claim 1, wherein said back metal film is connected with either a ground or a power source.

3. The semiconductor device according to claim 1, wherein said back metal film is divided into several pieces.

4. The semiconductor device according to claim 3, wherein said back metal film is divided at least into a part connected with a ground and a part connected with a power source.

5. The semiconductor device according to claim 1, further comprising:
a second wiring connected electrically with said back metal film and covering from above said semiconductor element, wherein
said back metal film covers from below said semiconductor element.

6. The semiconductor device according to claim 1, wherein a circuit region including at least one of a transistor, an inductor, a varactor and a resistance is provided in said semiconductor device, and
said predetermined position of said support substrate is below said circuit region.

7. The semiconductor device according to claim 1, wherein said metal back film is formed of a material except for a conductor.

8. The semiconductor device according to claim 1, wherein said first plug and said second plug are formed in one and there is no boundary therebetween.

9. The semiconductor device of claim 1, wherein said second plug is directly connected to the back metal film.

10. The semiconductor device of claim 1, wherein said back metal film is not connected to a signal line.

* * * * *